United States Patent
Yang et al.

(10) Patent No.: US 11,315,859 B1
(45) Date of Patent: Apr. 26, 2022

(54) POWER MODULE

(71) Applicant: SEMICONDUCTOR COMPONENTS INDUSTRIES, LLC, Phoenix, AZ (US)

(72) Inventors: Qing Yang, Shenzhen (CN); Yong Liu, Cumberland Foreside, ME (US); Yushuang Yao, Shenzhen (CN)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 14 days.

(21) Appl. No.: 16/949,262

(22) Filed: Oct. 22, 2020

(51) Int. Cl.
| | |
|---|---|
| *H01L 23/498* | (2006.01) |
| *H01L 23/32* | (2006.01) |
| *H01L 25/07* | (2006.01) |
| *H01L 21/48* | (2006.01) |
| *H01L 25/18* | (2006.01) |
| *H01L 23/00* | (2006.01) |
| H01L 23/373 | (2006.01) |

(52) U.S. Cl.
CPC .... *H01L 23/49811* (2013.01); *H01L 21/4817* (2013.01); *H01L 21/4853* (2013.01); *H01L 23/32* (2013.01); *H01L 23/562* (2013.01); *H01L 25/072* (2013.01); *H01L 25/18* (2013.01); H01L 23/3735 (2013.01)

(58) Field of Classification Search
CPC .................................................. H01L 23/562
See application file for complete search history.

(56) References Cited

U.S. PATENT DOCUMENTS 9,620,877 B2 * 4/2017 Yao ........................ H01R 12/57

OTHER PUBLICATIONS

Infineon, "HybridPACCK Drive, Assembly Instructions for the HybridPACK Drive", rev. 1.4, May 28, 2019.

* cited by examiner

*Primary Examiner* — Selim U Ahmed
*Assistant Examiner* — Evan G Clinton
(74) *Attorney, Agent, or Firm* — Brake Hughes Bellermann LLP

(57) ABSTRACT

A power module can include a casing mounted to a baseplate that contains a substrate with circuitry. The circuitry can include pins for coupling signals to/from the circuitry. These pins can extend through a cover portion of the casing so that an electronic substrate, such as a printed circuit board (PCB) can be press-fit onto the pins. When press-fit, the electronic substrate is supported and positioned by support pillars that extend from the base plate to above the cover portion of the casing. If the pins and the support pillars have different coefficients of thermal expansion, damage to connection points between the pins and the circuitry may occur. Here, a power module is disclosed that has thermally matched pins and support pillars so that when the system is thermally cycled over a range of temperatures, the connection points are not damaged by forces induced by thermal expansion.

20 Claims, 7 Drawing Sheets

POWER MODULE

FIELD OF THE DISCLOSURE

The present disclosure relates to electronic power modules and more specifically to a power module that includes features to prevent defects.

BACKGROUND

A power module can include a substrate to which components (e.g., power transistors, power diodes, etc.) are attached (e.g., soldered). The components may be attached (e.g. soldered, sintered) as die to a top surface of the substrate. The top surface of the substrate may include metal traces to electrically connect the components. Pins may also be attached (e.g. soldered) to the traces on the substrate to provide connection points to an externally coupled electronic substrate (e.g., printed circuit board). Defects in the connection points of the pins can prevent proper operation of the power module and/or the electronic substrate.

SUMMARY

In at least one aspect, the present disclosure generally describes a power module. The power module includes a baseplate. A substrate is coupled (e.g., affixed) to the baseplate. The substrate includes a top metal layer to which pins are attached at connection points (e.g., solder joints). The power module further includes a casing. The casing includes a side portion coupled to the baseplate that surrounds (at least partially) the substrate and a cover portion coupled to the side portion that covers the substrate. The cover portion of the casing includes pin holes through which the pins extend. The power module further includes support pillars that are configured to extend from the baseplate to above the cover portion of the casing. The support pillars have a coefficient of thermal expansion that approximately equals a coefficient of thermal expansion of the pins. The approximately equal thermal expansion coefficients can prevent damage to any of the connection points when the power module and an electronic substrate, which is press-fit with the pins and supported by the support pillars, are thermally cycled (i.e., temperature cycled, thermal cycled) over a range of temperatures.

In one possible implementation, each of the support pillars is unitary and separate from the casing. In this implementation, the casing includes clearance holes for the support pillars.

In another possible implementation, each of the support pillars are bonded with the casing so that the support pillars are not unitary and separate from the casing. For example, the casing can be injection molded with the support pillars.

In another aspect, the present disclosure generally describes a power system. The power system includes a power module and an electronic substrate. The power module includes a baseplate and a substrate affixed to the baseplate. The substrate includes a top metal layer to which pins are attached at connection points (e.g., solder joints). The power module further includes a casing. The casing includes a side portion coupled to the baseplate that surrounds (at least partially) the substrate and a cover portion coupled to the side portion that covers the substrate. The cover portion of the casing includes pin holes through which the pins extend. The power module further includes support pillars that are configured to extend from the baseplate to above the cover portion of the casing. The electronic substrate is press-fit to the pins and attached at the support pillars. The support pillars and the pins have coefficients of thermal expansion that are approximately equal so that when the power system is cycled thermally over a range of temperatures, the connection points are not damaged by forces induced by thermal expansion.

In another aspect, the present disclosure generally describes a method for fabricating a power module. The method includes affixing a substrate, which includes a top metal layer, to a baseplate. The method further includes soldering pins to the top metal layer so that a solder joint is formed between each pin and the top metal layer. The method further includes attaching a side portion of a casing to the baseplate so that the side portion surrounds the substrate at least partially. The side portion of the casing includes either integrated support pillars or clearance holes for receiving support pillars (i.e., through which support pillars may pass). When the side portion of the casing includes clearance holes, the method further includes attaching the support pillars to the baseplate. In either case, the method further includes attaching a cover portion to the side portion so that (i) the cover portion covers the substrate, (ii) the pins extend through pin holes in the cover portion, and (iii) the support pillars extend from the baseplate to above the cover portion. The support pillars and the pins have coefficients of thermal expansion that are approximately equal.

The foregoing illustrative summary, as well as other exemplary objectives and/or advantages of the disclosure, and the manner in which the same are accomplished, are further explained within the following detailed description and its accompanying drawings.

BRIEF DESCRIPTION OF THE DRAWINGS

The components in the drawings are not necessarily to scale relative to each other. Like reference numerals designate corresponding parts throughout the several views.

DETAILED DESCRIPTION

As described herein, a power module can include a substrate (e.g., direct bonded copper (DBC) substrate) to which components (e.g., power transistors, power diodes, etc.) are attached (e.g., soldered). The components may be attached as die to a top surface of the substrate. The top surface of the substrate may include metal traces to electrically connect the components. For example, a pad on a die of a component may be wire bonded to a metal trace on the substrate, which, in turn, may be welded to a lead frame. Pins may also be attached (e.g. soldered) to the traces on the substrate to provide connection points. A bottom surface of the substrate may be affixed (e.g., soldered) to a baseplate. A housing (i.e. casing) may also be affixed (e.g., epoxied) to the baseplate so that the substrate and the components are contained within an interior defined by the baseplate and the casing. A cover portion of the casing, opposite to the baseplate, may include holes through which the pins can extend to provide exterior connection points to the components and circuitry contained within the casing. After fabrication, the power module can be coupled at a bottom surface of the baseplate to a heatsink. In addition, the pins extending through the top surface of the casing can be electrically/mechanically coupled (e.g., press-fit) to vias in an electronic substrate, such as a printed circuit board (PCB).

Power module package configurations that reduce or eliminate force-created defects in pin connections by reducing or eliminating the thermal expansion differences are presented. This thermal matching may have the technical effect of increasing a performance (e.g., lifetime, production yield, repairs, field failures, etc.) of a power module, and a power system more generally.

Figure 1:
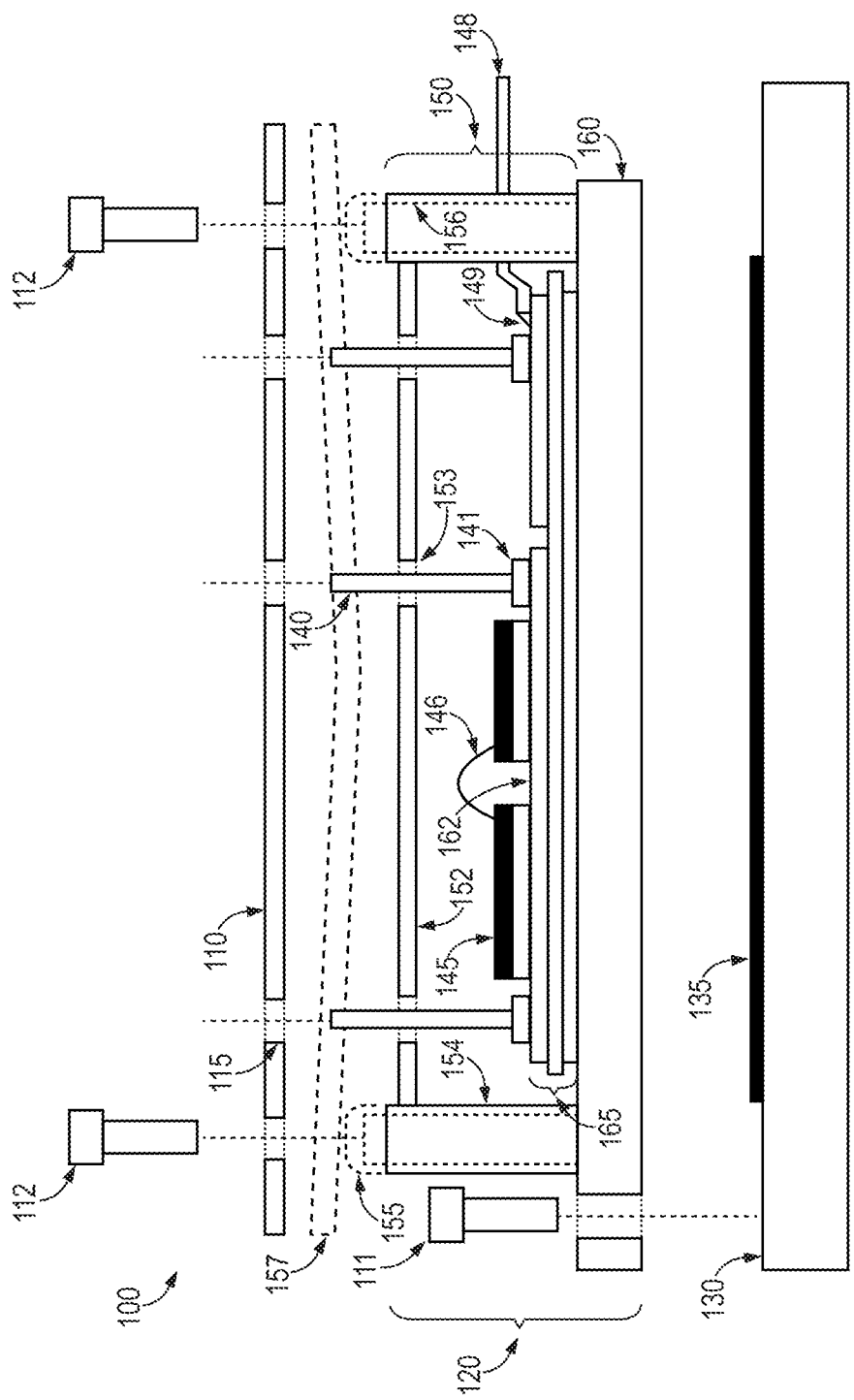
FIG. 1 illustrates a side, exploded view of a power system.

FIG. 1 illustrates a side, exploded view of an example power system. In the figure, portions specified with terms like upper, top, etc. refer to portions that are nearer to the top of the page than portions specified with terms like lower, bottom, etc. Likewise, portions specified with terms like left are nearer to the left side of the page than portions specified with terms like right. It should be recognized that these specifications represent a chosen frame of reference that is not intended to be limiting because almost any frame of reference can be used to describe the portions.

As shown in FIG. 1, the power system 100 can include a power module 120. The power module 120 can include a baseplate 160 and a casing 150. The casing 150 may include a side portion 154 and a cover portion 152. The casing 150 can be coupled (e.g., epoxied) to a top surface of the baseplate 160 so that an interior of the casing 150 is defined. The power module 320 may include a substrate 165 (e.g., DBC substrate) that can be coupled (e.g., at a bottom metal layer of the substrate) to a top surface of the baseplate 160 so that it is contained within the interior of the casing 150. The substrate 165 may include a top metal layer 162 (e.g., copper traces and pads) to which components 145 and pins 140 are attached at connection points (e.g. solder joints 141). The components 145 may also be coupled to each other via wire-bonds 146 and the top metal layer 162 may be coupled to a terminal finger 148 (i.e., lead frame) at one or more weld points 149.

The power system 100 can also include a heatsink 130. The heatsink 130 may be attached to a bottom surface of the baseplate 160. A thermal interface material (TIM 135) can be used to decrease a thermal resistance between the baseplate 160 and the heatsink 130. In a possible implementation, the heatsink 130 is bolted to the baseplate 160 with a screw 111 (or screws), and the TIM 135 is sandwiched between a top surface of the heatsink 130 and a bottom surface of the baseplate 160.

The power system 100 can also include a electronic substrate 110, such as a PCB. The electronic substrate 110 can include circuitry (i.e., components, traces, and interconnections) designed to connect with the circuitry of the power module 120 through the pins 140. The pins 140 can protrude (i.e., extend) through pin holes 153 in the casing 150 (e.g., the cover portion 152) to facilitate this connection. The electronic substrate 110 may include vias 115 (e.g., plated through holes) that are arranged spatially and sized to receive (i.e., mate) with the pins 140. A press-fit may be created between the pins 140 and the vias 115 when the electronic substrate 110 is pressed onto the pins 140. The press-fit provides an electrical and mechanical connection between the electronic substrate 110 and the pins 140.

Figure 2:
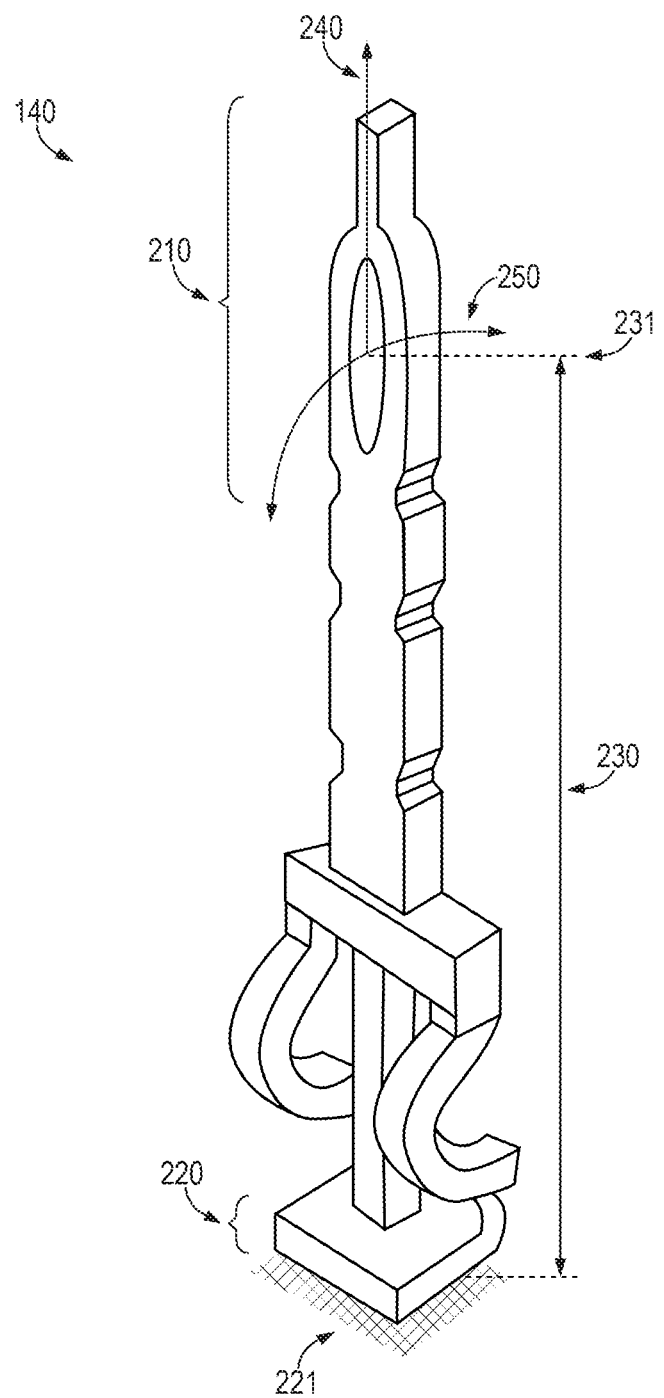
FIG. 2 illustrates a perspective view of a pin for a power module according to a possible implementation of the present disclosure.

FIG. 2 illustrates a perspective view of one possible pin 140 that can be used for the power module. The pin implementation shown in FIG. 2 is presented as an example and is not intended to be limiting. Variations in pin parameters (e.g., shape, relative dimensions, etc.) may exist without departing from the discussion that follows. In a top portion, the pin 140 can include a spring feature 210 (e.g., leaf-spring) that is compressed when the pin 140 is press-fit into a via 115. The compression of the spring feature 210 can exert a force onto an inner surface of the via 115, which acts to anchor (i.e., hold, clamp, etc.) the pin 140 to the via 115. The spring feature 210 may have a location (i.e., an anchor point 231) desirable for the press-fit. For example, an electronic substrate, such as a PCB, may be held sufficiently (e.g., optimally) when a via 115 interfaces the spring feature 210 at the anchor point 231. Accordingly, features in the casing 150 may be provided to position and hold the electronic substrate at a height 230 that ensures that the via interfaces the spring feature 210 at the anchor point 231.

Setting a height 230 of the electronic substrate 110 relative to a pin 140 may be facilitated by one or more features in the casing 150. For example, dome features 155 (i.e., domes) may be molded into a casing (e.g., side portion) to support and position the electronic substrate during press-fitting. After the press-fit, the electronic substrate may be affixed to the casing (i.e., to the dome features 155) by a screw 112. One problem with this molded dome feature approach corresponds to a difference between a material used for the dome features 155 (i.e., casing material) and a material used for the pin 140 (i.e., pin material).

The casing may be fabricated from a first material (i.e., casing material), which can be selected based on properties, such as electrical isolation and compatibility with fabrication (e.g., compatibility with an injection molding process). For example, the casing material can be a thermoplastic polymer, such as polybutylene terephthalate (PBT). PBT may have a first coefficient of thermal expansion (CTE) that is in a range of $30 \times 10^{-6}$ to $100 \times 10^{-6}$ per Kelvin ($K^{-1}$) (i.e., 30-100 ppm/K).

The pin may be fabricated from a second material (i.e., pin material), which can be selected based on properties, such as electrical conduction and mechanical strength. For example, the pin material can be a metal, such as copper alloy. Copper alloy may have a second CTE that is approximately $17 \times 10^{-6}$ $K^{-1}$ (i.e., 17 ppm/K).

The first CTE of the casing material can be much greater than the second CTE of the pin material. In other words, the casing material may change in one or more dimensions (i.e., expand, contract) more than the pin material as temperature is changed. Because the electronic substrate is coupled to both the casing and the pin, the thermal expansion difference can cause undesirable forces at a temperature (T) that is higher or lower than a temperature of fabrication (e.g., room temperature).

The power module 120 may be expected to operate over a large range of temperatures. For example, the power module may be expected to withstand (either operating or non-operating) temperatures in a range of temperatures. Accordingly, during use or in a test, the power module may be thermally cycled over the range of temperatures. This range of temperatures may be from approximately (e.g., ±5° C.) minus 40 degrees Celsius (° C.) to approximately (e.g., ±5° C.) positive 125 degrees Celsius (i.e., −40° C.≤T≤+125° C.). For example, as a temperature of the power module is increased, the casing material can expand more than the pin material. The expansion of the dome features 155 can be compared to the expansion of a pillar 156 that is thermally matched with a pin 140. The expanded dome features 155 in can create forces that produce a distorted electronic substrate 157 (e.g., PCB), having portions pushed higher than other portions because of counteracting forces between the dome features 155 and the anchor points of the pins. The forces induced by thermal expansion, when combined with the clamping forces of the press-fit, can pull the one or more of the pins away from the substrate (i.e., can place mechanical stress on the connection points of the pins).

Figure 3:
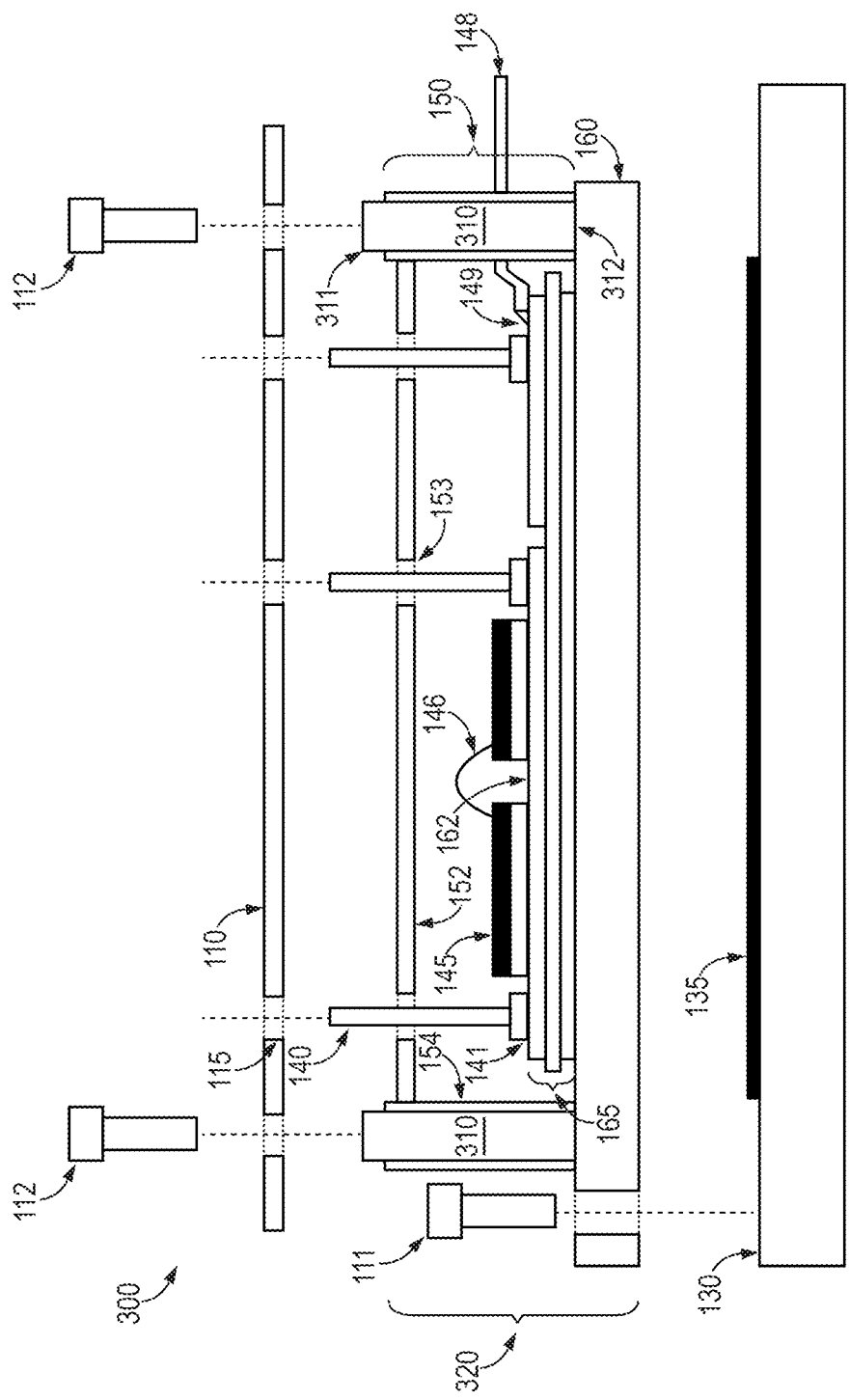
FIG. 3 illustrates a side, exploded view of a power system having thermally matched support pillars according to an implementation of the present disclosure.

At a high temperature (e.g., 125° C.) the forces on the electronic substrate can cause a lateral force 250 and/or a tensile force 240 on the pin 140, as shown in FIG. 2. The lateral force 250 and/or the tensile force 240 may be sufficient to create a defect in (i.e. to damage) a connection (e.g., solder joint 141) between the pin and the substrate in a connection area 221 of a bottom portion 220 of the pin 140. A defect can be a crack in a solder joint, a break in a solder joint, and/or detachment (i.e., peel, lift) of the solder joint. The defect may affect an electrical and/or a mechanical property of the connection. For example, electrical conduction of signals and/or power between the substrate circuitry and the circuitry of the press-fit electronic substrate may be reduced or eliminated. A power module having small thermal expansion differences between elements (i.e., having elements that are thermally matched) can help reduce or eliminate force-created defects at solder joints FIG. 3 illustrates a side, exploded view of a power system 300 having thermally matched support pillars according to an implementation of the present disclosure. The support pillars are each configured to position and hold the electronic substrate at a height. For example, a support pillar 310 may position the electronic substrate 110 at a height that ensures that, after press-fitting, a via 115 of the electronic substrate interfaces with a pin 140 of the power module 120 at a height suitable for an electrical and mechanical connection (e.g., at the anchor point 231).

The support pillar 310 may be fabricated from the same material as the pin 140. In other words, a material of the support pillar 310 (i.e. a support-pillar material) may be the material of the pin (i.e. a pin material). Accordingly, the support-pillar and the pin can be a metal, such as copper alloy. In this case, a CTE of the support-pillar material may be equal to or substantially the same (e.g., <1%) the CTE of the pin material. In other words, the support-pillar may be thermally matched to the pin.

It may be advantageous, in some implementations, to use the same material for both the pins and the support pillars so that there is substantially no CTE difference (i.e., ΔCTE≈0). The present disclosure is not limited to this implementation, however, because it may be possible to select different materials for the pin and support pillars that have a CTE difference that is smaller than a maximum CTE (i.e., $\Delta CTE < \Delta CTE_{MAX}$), where the maximum CTE corresponds to an expansion difference found (e.g., empirically found) to cause damage a connection point (e.g., solder joint) at a high temperature (e.g., 125° C.).

Thermally matched support pillars can result in a reduction or elimination of forces on a pin (or pins) as a temperature of the power module 320 is changed (e.g., increased). In other words, at a high temperature (e.g., 125° C.), a support pillar 310 that is thermally matched with the pin can expand substantially the same as a pin 140. Accordingly, at the high temperature, an expansion of the support pillar 310 will not create the lateral force 250 and/or the tensile force 240 on the pin 140 that is sufficient to create a defect (e.g., break, crack, peel, lift) in a connection point (e.g., solder joint 141) between the pin 140 and the substrate 165. In this way, the thermally matched support pillars can help reduce electrical failures in the power system that result from damage of the solder joints.

As shown in FIG. 3, each support pillar 310 can be attached at a first end 311 to the electronic substrate 110. The attachment of the support pillar 310 at the first end 311 to the electronic substrate 110 may be accomplished variously. For example, the electronic substrate 110 may be bolted to the support pillar 310 by means of a screw 112. Accordingly, the support pillar 310 may include a tapped hole at the first end 311 into which the screw 112 may be affixed (i.e., tightened). Each support pillar 310 can also be attached (at least) at a second end 312 to the baseplate 160.

Figure 4:
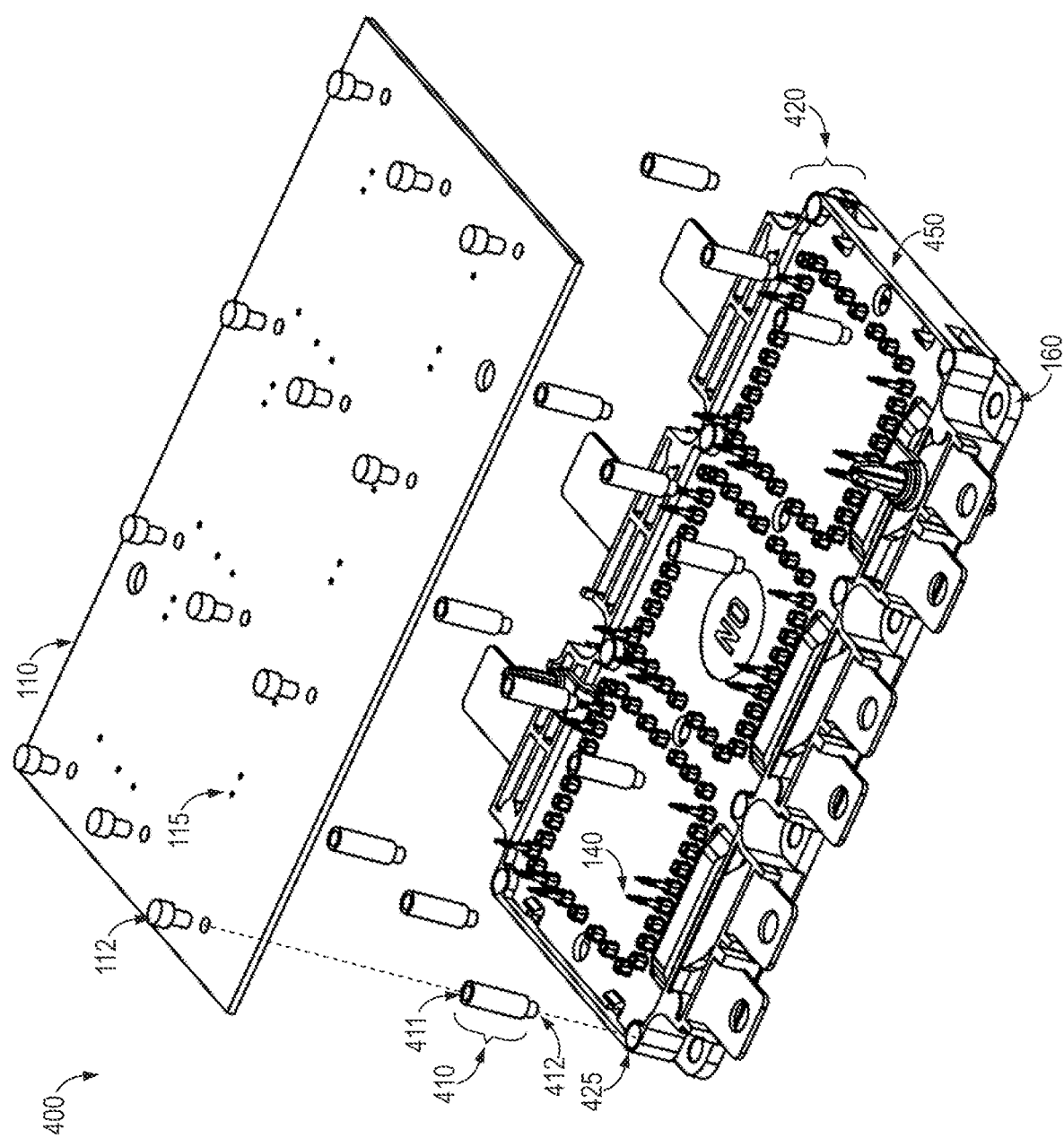
FIG. 4 illustrates a perspective, exploded view of a power system having thermally matched support pillars configured for attachment to a baseplate according to a first possible implementation of the present disclosure.

FIG. 4 illustrates a perspective, exploded view of a power system having thermally matched support pillars according to a first possible implementation. In the first possible implementation, each support pillar 410 is unitary and separate from the casing. The power system 400 includes an electronic substrate 110 and a power module 420. The power module 420 includes a baseplate 160 onto which a casing is mounted. The power module 420 includes pins that can protrude through the casing to press-fit with vias 115 in the electronic substrate 110. The electronic substrate can be held and positioned at a height by thermally matched support pillars. While any number of thermally matched support pillars may be used, there are twelve thermally matched support pillars used in the implementation shown in FIG. 4.

As discussed, each support pillar 410 (i.e. thermally matched support pillar) may include a threaded hole 411. The electronic substrate 110 may be held to each support pillar 410 by a screw 112 affixed to a threaded hole 411 at the first end of the support pillar 410. For the implementation shown, each support pillar 410 further includes a threaded portion (i.e., a screw portion 412) at the second end of the support pillar. Each support pillar 410 may be held to the baseplate 160 by affixing the screw portion 412 of the support pillar 310 to a corresponding threaded hole in the baseplate (not shown). In the implementation shown, each support pillar 410 is unitary and physically separate from the casing 450. Accordingly, the casing may include clearance holes 425 to provide the support pillars access to the baseplate 160.

Figure 5:
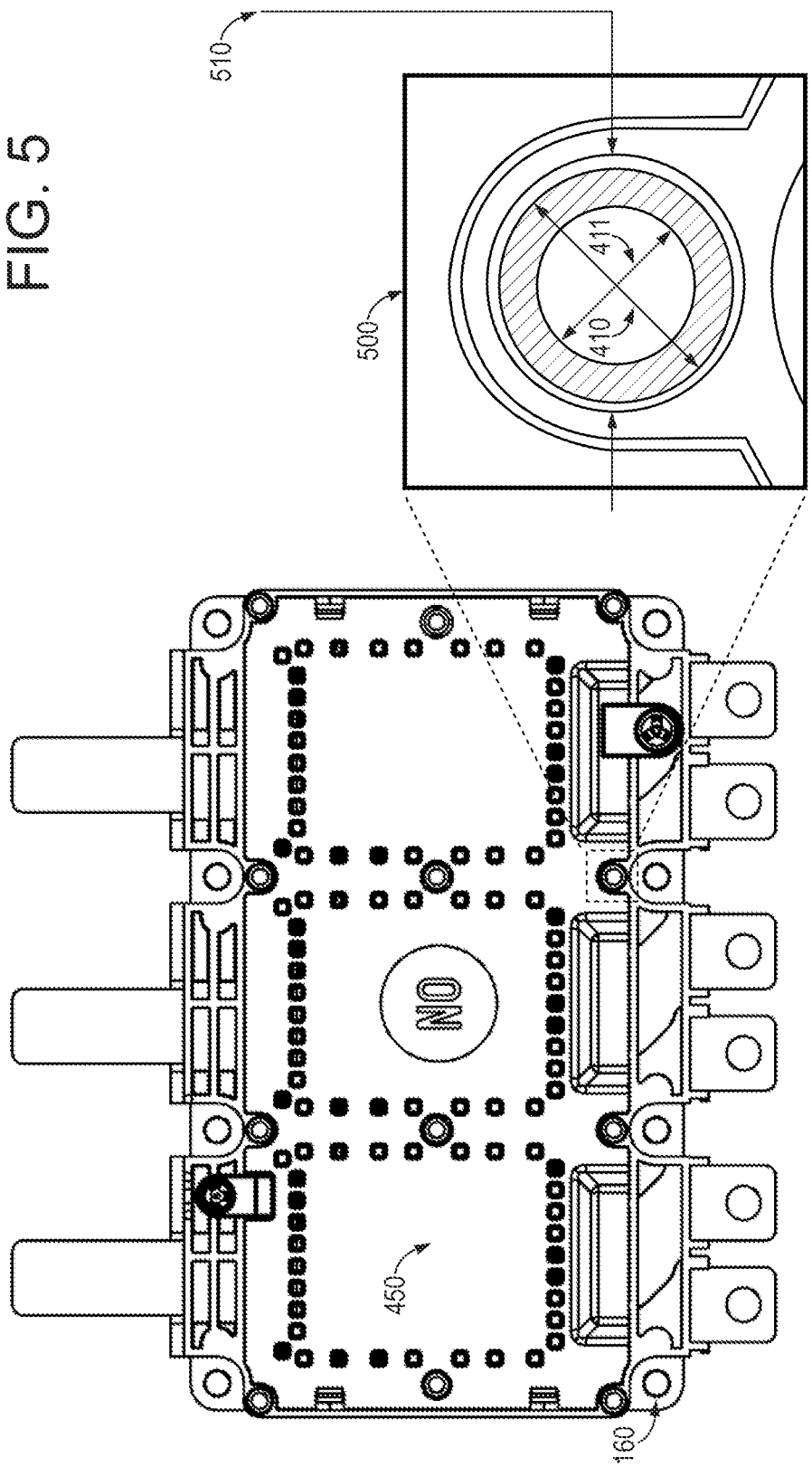
FIG. 5 illustrates a top view of the power system of FIG. 4 further illustrating details of the casing, baseplate, and thermally matched support pillars.

FIG. 5 illustrates a top view of the power module 420 of FIG. 4. The figure includes an inset 500 further illustrating details of the casing, baseplate, and a thermally matched support pillar. As shown in the inset 500, the casing 450 includes a clearance hole 510 through which a support pillar 410 may extend from a top surface of the baseplate to the electronic substrate. The support pillar 410 includes a threaded hole 411 to which an electronic substrate 110 may be bolted. In other words, the thermally matches support pillars can be unitary and physically separate from the casing. Further, the unitary and separate support pillars can be screw-mounted to the baseplate.

Figure 6:
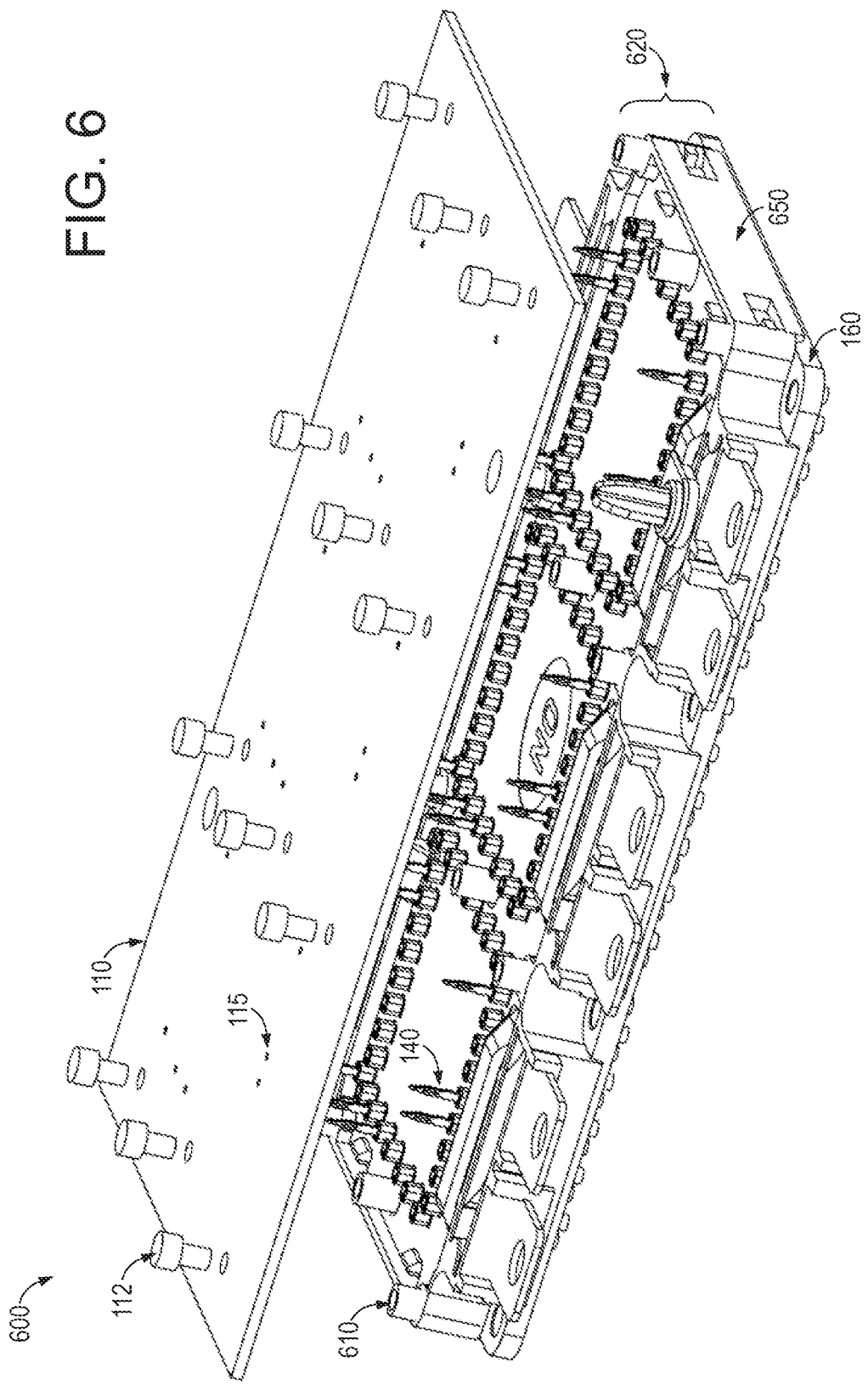
FIG. 6 illustrates a perspective, exploded view of a power system having thermally matched support pillars integrated with the casing according to a second possible implementation of the present disclosure.

FIG. 6 illustrates a perspective, exploded view of a power system having thermally matched support pillars according to a second possible implementation. In the second possible implementation, the thermally matched support pillars 610 are integrated with the casing. The power system 600 includes an electronic substrate 110 and a power module 620. The power module 620 includes a baseplate 160 onto which a casing 650 is mounted. The power module 620 includes pins 140 that can protrude through the casing to press-fit with vias 115 in the electronic substrate 110. The electronic substrate 110 can be held and positioned at a height by thermally matched support pillars 610. As shown, the possible implementation includes twelve thermally matched support pillars 610 arranged in four rows of three. The support pillars can be molded with a side portion of the casing 650 which implies that the side portion of the casing can further include a perimeter portion that surrounds a perimeter of the casing 650 and cross portions that span opposite sides of the perimeter portion.

In the second possible implementation the thermally matched support pillars 610 can be affixed to the casing of the power module 620. Each support pillar may be cylindrical, having a top surface, a bottom surface and a cylindrical side surface. The top surface can be flat, the bottom surface can be flat, and the cylindrical side surface can be curved. The casing may be adhered to a portion of the curved, cylindrical side surface. For example, each thermally matched support pillar 610 may be adhered to a portion of the curved cylindrical surface during a molding process. Accordingly, a first portion of the support pillar may be adhered to the casing, while a second portion of the support pillar may extend above a top surface of the casing to a height (e.g. corresponding to the anchor point). The bottom, flat surface of the support pillar may be contiguous with the top surface of the baseplate 160 so that an expansion of the casing material does not affect the height of the support pillar above the top surface of the casing 650.

While a power module may be fabricated using a process that includes a front-end process related to the circuitry of the substrate and a back-end process related to the packaging of the substrate, the back-end process will be discussed. In this discussion the back-end fabrication process will be referred to simply as the fabrication process.

Figure 7:
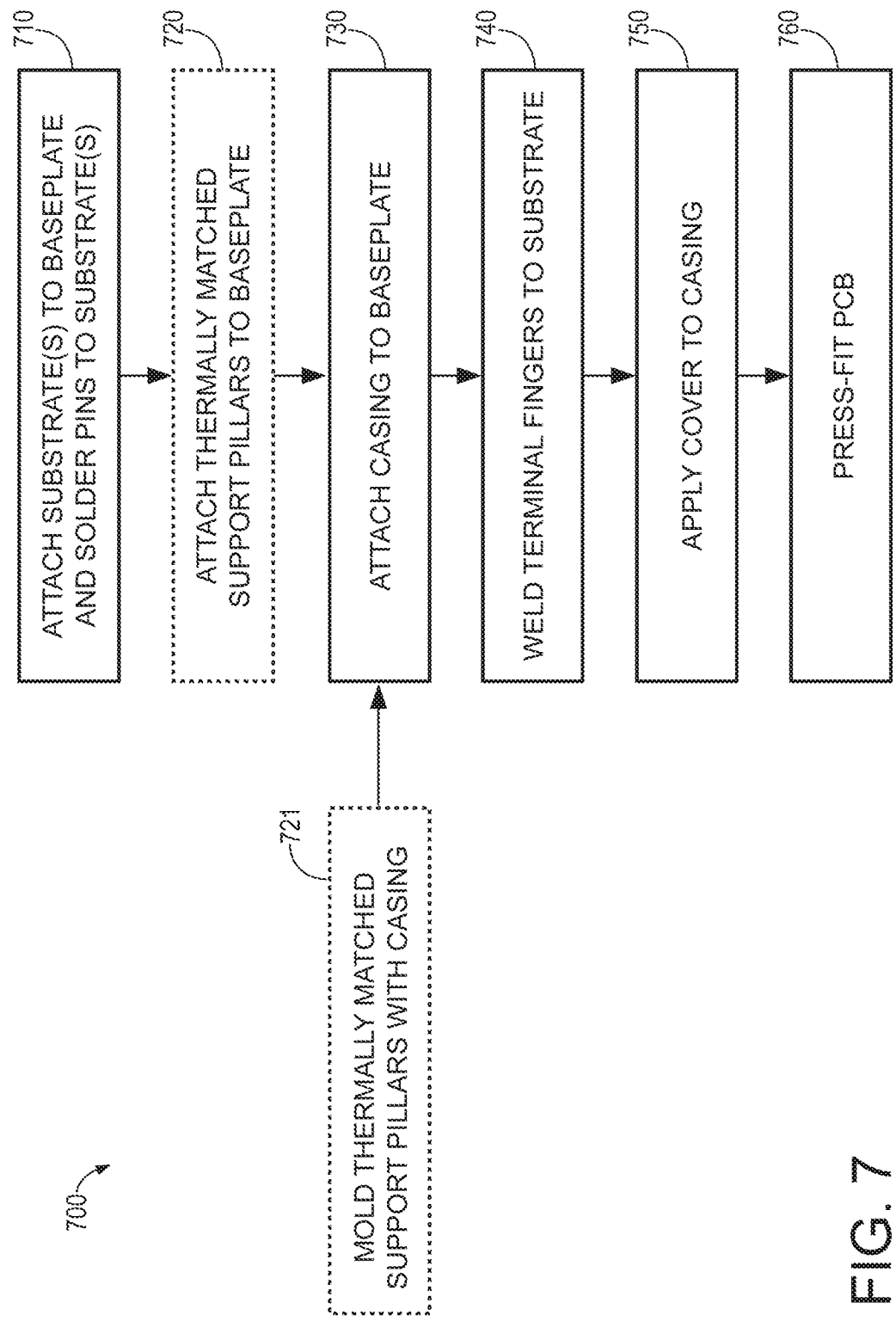
FIG. 7 illustrates a flow chart of a method for fabricating a power module according to possible implementations of the present disclosure.

The first implementation of the power module (see FIG. 4) and the second implementation of the power module (see FIG. 6) may require differences in a fabrication process (i.e., a method for fabricating). FIG. 7 illustrates a flow chart of a method for fabricating a power module according to a first possible implementation or a second possible implementation of the present disclosure. In the method 700, a substrate (or substrates) may be attached 710 to a baseplate. For example, the substrate may be a DBC substrate having a bottom conductor (i.e., bottom metal layer). The DBC may be attached to the baseplate by soldering the bottom metal layer to the metal baseplate. This soldering portion of the method 700 may also include soldering the pins to the substrate. For example, the press-fit pins may be soldered to a top conductor (i.e., top metal layer) of a DBC substrate.

In a first possible implementation, the method may further include attaching 720 thermally matched support pillars to the baseplate. As shown in FIG. 4 this operation may include screw fitting the support pillars to the baseplate. In a second possible implementation, the method includes molding 721 the thermally matched support pillars with the casing instead of attaching (e.g., screw fitting) them to the baseplate The method further includes attaching 730 a casing to the baseplate. For example, the casing may include a side portion (i.e., side portion) and a cover portion, and the attaching the casing operation may include affixing (e.g., epoxying) the side portion to the baseplate so that the side walls surround the substrate (or substrates). In the first possible implementation, the side portion may include clearance holes that the support pillars may be inserted through as the casing is affixed to the baseplate. In this implementation, the support pillars may help to fixture the casing during the attachment. In the second possible implementation, the side portion including the support pillars may be affix to the base plate without the need of coupling the support pins through the clearance holes.

After the casing is attached to the baseplate, the method includes welding 740 terminal figures to the substrate. The cover portion (i.e., cover) of the casing can then be applied 750 (e.g., epoxied to the side portion of the casing) so that the substrate is contained in the area defined by the casing and the baseplate. The applying the cover may include affixing (e.g., epoxying) the cover portion to the side portion. After the cover is applied the power module is complete and may be electrically tested before an electronic substrate (e.g., PCB) is press-fit 760 onto the pins of the power module and the electronic substrate is connected to the support pillars. For example, a user may press-fit a user's electronic substrate (e.g., PCB) onto the power module for a particular application.

The disclosed power module can reduce defects (i.e., failures, damage) to connection points (e.g., solder joints) due to thermal cycling (e.g., from −40° C. to +125° C.). To achieve this effect, the disclosed power module can use equivalent materials for the pins and the support pillars. Equivalent materials can be materials having coefficients of thermal expansion that are equal (i.e., the same), approximately equal (i.e., substantially the same), or similar. For example, pins and the support pillars can be exactly the same material. In these implementations, coefficients of thermal expansion can be precisely equal. Pins and support pillars can be materials of the same type (e.g., copper alloy) but from different batches, manufacturers, etc. In these implementations, the coefficients of thermal expansion can be approximately equal (e.g., within 5%). Pins and support pillars can be different materials (e.g., different metals). In these implementations the coefficients of thermal expansion can be similar (e.g., within 25% percent) but not equal. For example, different materials may be used for the pins and the support pillars as long as connection points (e.g., solder joints between pins and a top metal layer of the substrate) are not damaged (i.e., lifted, cracked, broken etc.) by forces induced by thermal expansion as the temperature is changed (e.g., cycled).

While certain features of the described implementations have been illustrated as described herein, many modifications, substitutions, changes and equivalents will now occur to those skilled in the art. For example, the casing has been described as having integrated support pillars or as (alternatively) having clearance holes through which the support pillars may pass for attachment to the baseplate. It is recognized that one possible modification includes a casing having both integrated support pillars and clearance holes configured to receive support pillars. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

It will be understood that, in the foregoing description, when an element is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element, there are no intervening elements present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Unless defined otherwise, all technical and scientific terms used herein have the same meaning as commonly understood by one of ordinary skill in the art. Methods and materials similar or equivalent to those described herein can be used in the practice or testing of the present disclosure. As used in the specification, and in the appended claims, the singular forms "a," "an," "the" include plural referents unless the context clearly dictates otherwise. The term "comprising" and variations thereof as used herein is used synonymously with the term "including" and variations thereof and are open, non-limiting terms. The terms "optional" or "optionally" used herein mean that the subsequently described feature, event or circumstance may or may not occur, and that the description includes instances where said feature, event or circumstance occurs and instances where it does not. Ranges may be expressed herein as from "about" one particular value, and/or to "about" another particular value. When such a range is expressed, an aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

The invention claimed is:

1. A power module, comprising:
a baseplate;
a substrate coupled to the baseplate, the substrate including a top metal layer to which pins are attached at connection points;
a casing including:
a side portion coupled to the baseplate that at least partially surrounds the substrate, and a cover portion coupled to the side portion that covers the substrate, the cover portion including pin holes through which the pins extend; and
support pillars configured to extend from the baseplate to above the cover portion of the casing, the support pillars having a coefficient of thermal expansion approximately equal to a coefficient of thermal expansion of the pins.

2. The power module according to claim 1, wherein:
the support pillars are configured to support an electronic substrate that is press-fit with the pins; and
the support pillars and the pins have coefficients of thermal expansion that are approximately equal to prevent damage to any of the connection points when the power module and the electronic substrate that is press-fit with the pins are thermally cycled over a range of temperatures.

3. The power module according to claim 2, wherein the range of temperatures is from approximately −40 degrees Celsius to approximately 125 degrees Celsius.

4. The power module according to claim 2, wherein:
each connection point is a solder joint; and
the damage is at least one of a lift, a crack, a peel, or a break of the solder joint.

5. The power module according to claim 1, wherein:
the pins include a spring feature having an anchor point at a height above the substrate; and
the support pillars extend above the cover portion of the casing by an amount corresponding to the height of the anchor point.

6. The power module according to claim 1, wherein the support pillars and the pins are equivalent materials.

7. The power module according to claim 6, wherein the support pillars and the pins are a copper alloy.

8. The power module according to claim 1, wherein each of the support pillars is unitary and separate from the casing.

9. The power module according to claim 8, wherein each of the support pillars includes a screw portion configured to screw into the baseplate.

10. The power module according to claim 8, wherein the casing includes clearance holes for the support pillars.

11. The power module according to claim 1, wherein the support pillars are bonded with the casing so that the support pillars are not unitary and separate from the casing.

12. The power module according to claim 11, wherein:
the support pillars are metal;
the casing is a thermoplastic polymer; and
the support pillars and the casing are bonded by molding the thermoplastic polymer around the support pillars.

13. The power module according to claim 1, wherein:
a bottom metal layer of the substrate is soldered to the baseplate;
the side portion of the casing is epoxied to the baseplate; and
the cover portion of the casing is epoxied to the side portion of the casing.

14. A power system comprising:
a power module that includes:
a baseplate;
a substrate affixed to the baseplate, the substrate including a top metal layer to which pins are attached at connection points;
a casing including:
a side portion coupled to the baseplate that at least partially surrounds the substrate, and a cover portion coupled to the side portion that covers the substrate, the cover portion including pin holes through which the pins extend; and support pillars configured to extend from the baseplate to above the cover portion of the casing; and an electronic substrate press-fit to the pins and attached to the support pillars, the support pillars and the pins having coefficients of thermal expansion that are approximately equal.

15. The power system according to claim 14, wherein the coefficients of thermal expansion are approximately equal so that when the power system is thermally cycled over a range of temperatures, the connection points are not damaged by forces induced by thermal expansion.

16. The power system according to claim 15, wherein the range of temperatures is from approximately −40 degrees Celsius to approximately 125 degrees Celsius.

17. The power system according to claim 14, wherein each of the support pillars is unitary and separate from the casing.

18. The power system according to claim 14, wherein the support pillars are bonded with the casing so that the support pillars are not unitary and separate from the casing.

19. The power system according to claim 14, wherein:
the connection points are solder joints; and
the support pillars and the pins have coefficients of thermal expansion that are approximately equal to prevent at least one of a lift, a crack, a peel, or a break in any of the solder joints.

20. A method for fabricating a power module, the method comprising:

affixing a substrate to a baseplate, the substrate including a top metal layer;

soldering pins to the top metal layer so that a solder joint is formed between each pin and the top metal layer;

attaching a side portion of a casing to the baseplate so that the side portion at least partially surrounds the substrate, the side portion of the casing including integrated support pillars or the side portion including clearance holes configured to receive support pillars;

attaching the support pillars to the baseplate if the side portion of the casing includes clearance holes configured to receive support pillars; and attaching a cover portion to the side portion so that the cover portion covers the substrate, the pins extend through pin holes in the cover portion, and the support pillars extend from the baseplate to above the cover portion, the support pillars and the pins having coefficients of thermal expansion that are approximately equal.

\* \* \* \* \*